US011217412B2

(12) United States Patent
Haslinger

(10) Patent No.: US 11,217,412 B2
(45) Date of Patent: Jan. 4, 2022

(54) LOW-VOLTAGE CIRCUIT BREAKER DEVICE

(71) Applicant: Eaton Intelligent Power Limited, Dublin (IE)

(72) Inventor: Stefan Haslinger, Oberwaltersdorf (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 422 days.

(21) Appl. No.: 16/467,534

(22) PCT Filed: Dec. 7, 2017

(86) PCT No.: PCT/EP2017/081809
§ 371 (c)(1),
(2) Date: Jun. 7, 2019

(87) PCT Pub. No.: WO2018/104441
PCT Pub. Date: Jun. 14, 2018

(65) Prior Publication Data
US 2019/0371557 A1 Dec. 5, 2019

(30) Foreign Application Priority Data
Dec. 9, 2016 (DE) ..................... 10 2016 123 955.0

(51) Int. Cl.
*H01H 71/12* (2006.01)
*G01R 19/165* (2006.01)
(Continued)

(52) U.S. Cl.
CPC ............ *H01H 71/12* (2013.01); *G01R 19/165* (2013.01); *H01H 71/08* (2013.01); *H02H 3/08* (2013.01); *H02H 3/207* (2013.01)

(58) Field of Classification Search
CPC .......... H02H 3/08; H02H 3/025; H02H 3/027; H02H 3/207; H02H 3/16; H02H 3/38;
(Continued)

(56) References Cited

U.S. PATENT DOCUMENTS 9,401,599 B2 * 7/2016 Har-Shai ........... H01L 31/02021
10,211,627 B2 2/2019 Sachsenhauser et al.
(Continued)

FOREIGN PATENT DOCUMENTS

DE 202014100301 U1 3/2014
DE 102014102373 B3 1/2015
(Continued)

*Primary Examiner* — Kevin J Comber
(74) *Attorney, Agent, or Firm* — Leydig, Voit & Mayer, Ltd.

(57) ABSTRACT

A low-voltage circuit protection device includes: at least one outer conductor section from an outer conductor supply terminal of the low-voltage circuit protection device to an outer conductor load terminal of the low-voltage circuit protection device; a neutral conductor section from a neutral terminal of the low-voltage circuit protection device to a neutral load terminal of the low-voltage circuit protection device; an electrical measuring arrangement; at least one semiconductor circuit arrangement; and an electronic control unit which is connected to the electrical measuring arrangement and the semiconductor circuit arrangement. The measuring arrangement and/or the electronic control unit detects a predetermined combination of at least two electrical faults selected from the group including: overvoltage, undervoltage and overcurrent. The semiconductor circuit arrangement provides a specifiable reduction of an output voltage applied at the outer conductor supply terminal and the neutral conductor load terminal.

14 Claims, 1 Drawing Sheet

(51) Int. Cl.
  *H01H 71/08* (2006.01)
  *H02H 3/08* (2006.01)
  *H02H 3/20* (2006.01)

(58) Field of Classification Search
  CPC .......... H02H 7/26; H01H 71/08; H01H 71/12; H01H 83/20; H01H 9/542; H01H 2009/544; G01R 19/165
  USPC .......................................................... 361/90
  See application file for complete search history.

(56) References Cited

U.S. PATENT DOCUMENTS

| | | | | |
|---|---|---|---|---|
| 2007/0121257 | A1* | 5/2007 | Maitra | .................... H01H 9/542 |
| | | | | 361/2 |
| 2011/0102052 | A1* | 5/2011 | Billingsley | ............ H01H 9/542 |
| | | | | 327/365 |
| 2014/0078622 | A1* | 3/2014 | Crane | ..................... H02H 3/087 |
| | | | | 361/8 |
| 2017/0163023 | A1* | 6/2017 | Niehoff | .................. H02H 7/261 |

FOREIGN PATENT DOCUMENTS

| | | |
|---|---|---|
| DE | 102015202243 A1 | 8/2016 |
| EP | 2706640 A1 | 3/2014 |
| GB | 2527534 A | 12/2015 |
| WO | WO2015028634 A1 | 3/2015 |
| WO | WO2015098625 A1 | 7/2015 |

\* cited by examiner

LOW-VOLTAGE CIRCUIT BREAKER DEVICE

CROSS-REFERENCE TO PRIOR APPLICATIONS

This application is a U.S. National Phase application under 35 U.S.C. § 371 of International Application No. PCT/EP2017/081809, filed on Dec. 7, 2017, and claims benefit to German Patent Application No. DE 10 2016 123 955.0, filed on Dec. 9, 2016. The International Application was published in German on Jun. 14, 2018 as WO 2018/104441 under PCT Article 21(2).

FIELD

The invention relates to a low-voltage circuit protection device.

BACKGROUND

There are known circuit protection devices for a variety of special applications, which protect an electrical installation environment such as against ground fault currents or short-circuit currents.

There are also known circuit protection devices, which have a semiconductor switch in addition to mechanical isolating contacts. Such switching devices are usually referred to as hybrid switching devices. Such a hybrid switching device is known for example from WO 2015/028634 A1 of the Applicant.

A disadvantage of all these known switching devices or protection concepts is that in each case for the protection of the same electrical subnet against the effects of different electrical faults a specific circuit breaker is required for each. Thus, one residual current circuit breaker, one overcurrent/short circuit breaker, also referred to as a line circuit breaker, an arc detector/circuit breaker and a surge arrester are currently required for one and the same subnet to provide extensive protection. This represents a considerable effort in terms of installation of the necessary equipment and space requirements. In addition, due to the increasing complexity of the number of circuit protection devices, the effort for coordination with each other increases. This is associated with an increased risk of installation errors for the installer.

Another disadvantage that is common to all these conventional circuit protection devices is the fact that they turn off the downstream sub-network in an emergency or in the event of a detected error, and at the latest to the next zero crossing of the supply voltage, which means in the European integrated network that a shutdown occurs after a maximum of 10 ms. This has not been a particular disadvantage in the past, due to the usually simple electrical devices, but in the meantime represents a significant problem for the widely used computers, which are in the meantime installed as so-called embedded systems in almost all electrical devices.

SUMMARY

In an embodiment, the present invention provides a low-voltage circuit protection device, comprising: at least one outer conductor section from an outer conductor supply terminal of the low-voltage circuit protection device to an outer conductor load terminal of the low-voltage circuit protection device; a neutral conductor section from a neutral terminal of the low-voltage circuit protection device to a neutral load terminal of the low-voltage circuit protection device; an electrical measuring arrangement; at least one semiconductor circuit arrangement; and an electronic control unit which is connected to the electrical measuring arrangement and the semiconductor circuit arrangement, wherein the measuring arrangement and/or the electronic control unit is configured to detect a predetermined combination of at least two electrical faults selected from the group comprising: overvoltage, undervoltage and overcurrent, and wherein the semiconductor circuit arrangement is configured to provide a specifiable reduction of an output voltage applied at the outer conductor supply terminal and the neutral conductor load terminal of the low-voltage circuit protection unit relative to an input voltage applied to the outer conductor supply terminal and neutral conductor terminal of the low-voltage circuit protection device.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides a low-voltage circuit protection device of the type mentioned, with which the mentioned disadvantages can be avoided, with which the installation costs can be reduced, and which allows a partial or temporary re-use of downstream devices.

Thus, comprehensive protection of people and equipment against the direct and indirect dangers of electric power can be achieved with a single device. As a result, the cost of necessary protection devices is drastically reduced. As a result, the installation effort and the possibility to make mistakes are significantly reduced. This further makes it possible to not completely disconnect a downstream network, but for a short yet sufficient time to reduce the voltage applied to the subnet which is downstream of the low-voltage circuit protection device to the point that it is less dangerous for people and most equipment, but at the same time is sufficiently high for today's standard switching power supplies. As a result, the dangers of an electrical fault can be dispelled, while at the same time there is the possibility in the form of an emergency routine to secure relevant data or to stop processes before a complete shutdown of the network takes place.

Figure 1:
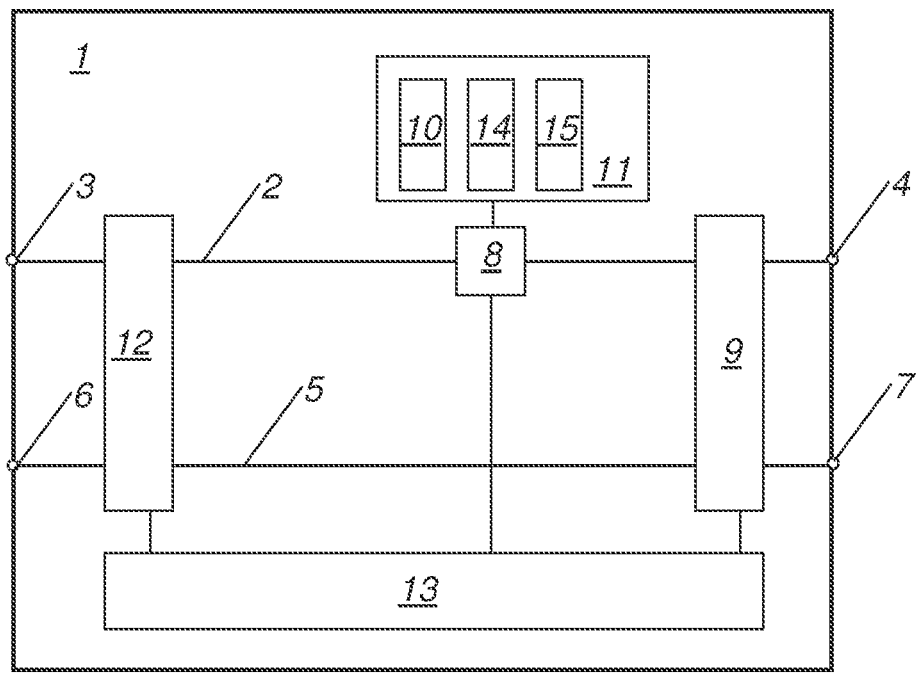
FIG. 1 is a block diagram of a first preferred embodiment of a subject low-voltage protection device.
Figure 2:
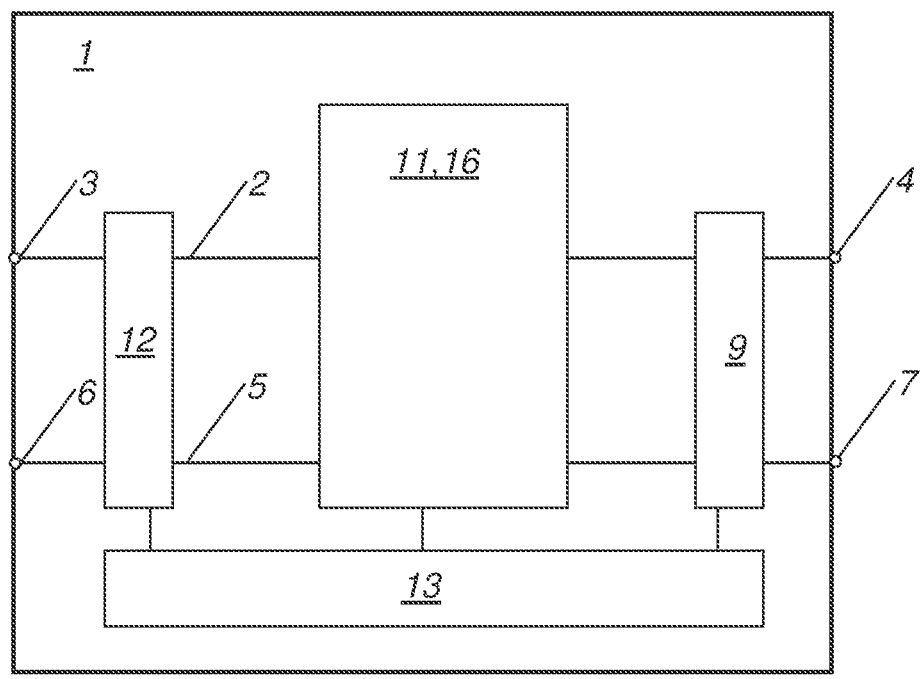
FIG. 2 is a block diagram of a second preferred embodiment of a subject low-voltage protection device.

FIGS. 1 and 2 respectively show block diagrams of preferred embodiments of a low-voltage circuit protection device 1 with at least one outer conductor section 2 from an outer conductor supply terminal 3 of the low-voltage circuit protection device 1 to an outer conductor load terminal 4 of the low-voltage circuit protection device 1, and a neutral conductor section 5 from a neutral terminal 6 of the low voltage circuit protection device 1 to a neutral load terminal 7 of the low-voltage circuit protection device 1, the low-voltage circuit protection device 1 having an electrical measuring arrangement 12, the low-voltage circuit protection device 1 having at least one semiconductor circuit arrangement 11, and the low-voltage circuit protection device 1 having an electronic control unit 13, which is connected to the measuring arrangement 12 and the semiconductor circuit arrangement 11, wherein the measuring arrangement 12 and/or the electronic control unit 13 is formed for detecting a specifiable combination of at least two, in particular three, preferably all, electrical faults selected from the group: Overvoltage, undervoltage, overcurrent, in particular short-circuit current, fault current and/or arc, and wherein the semiconductor circuit arrangement 11 is formed for specifiable reduction of an output voltage of the low-voltage circuit breaker 1 applied to the outer conductor supply terminal 3 and the neutral load terminal 7 against an input voltage of the low-voltage circuit breaker 1 applied to the outer conductor supply terminal 3 and the neutral terminal 6.

Thus, comprehensive protection of people and equipment against the direct and indirect dangers of electric power can be achieved with a single device. As a result, the cost of necessary protection devices is drastically reduced. As a result, the installation effort and the possibility to make mistakes are significantly reduced. This further makes it possible not to completely disconnect a downstream network, but for a short yet sufficient time on the subnet, which is downstream of the low-voltage circuit protection device 1, to reduce the applied voltage to such an extent that it is less dangerous for people and most equipment, but at the same time high enough for today's standard switching power supplies. As a result, the dangers of an electrical fault can be dispelled, while at the same time there is the possibility in the form of an emergency routine to secure relevant data or to stop processes before a complete shutdown of the network takes place.

The subject low-voltage circuit protection device 1 as well as the protective switching device according to WO 2015/028634 A1 are low-voltage circuit protection devices. The range up to 1000V AC voltage or 1500V DC voltage is referred to as low voltage, as usual.

The low-voltage circuit protection device 1 has an outer conductor section 2 and a neutral conductor section 5. The outer conductor section 2 extends through the low-voltage circuit protection device 1 from an outer conductor supply terminal 3 to an outer conductor load terminal 4. The neutral conductor section 5 extends through the circuit protection device 1 from a neutral terminal 6 to a neutral load terminal 7. The respective terminals 3, 4, 6, 7 are each preferably designed as screw terminals or plug-in terminals, and arranged in the low-voltage circuit protection device 1 to be accessible from the outside.

The low-voltage circuit protection device 1 preferably has an insulating housing.

The low-voltage circuit protection device 1 can be both an AC and a low-voltage DC protective device 1. The structural differences required in each case for adapting a protection device to use with direct current are familiar to the person skilled in the art and correspondingly applicable, in particular in the field of arc quenching.

A voltage applied to the outer conductor supply terminal 3 and the neutral terminal 6 is called the input voltage of the low-voltage circuit protection device 1. This is usually identical to the prevailing voltage of the respective supply network, about 240V. An electrical voltage applied to an outer conductor supply terminal 3 and neutral load terminal 7 is called output voltage of the low-voltage circuit protection device 1.

The low-voltage circuit protection device 1 has an electrical measuring arrangement and an electronic control unit 13, the electrical measuring arrangement 12 being connected to the electronic control unit 13 by telecommunications.

It is provided that the measuring arrangement 12 and/or the electronic control unit 13 are designed to detect different electrical faults. It is known that some electrical errors, such as overcurrents, can be detected directly by comparing a determined measured value with a limit value. It is also known that other electrical faults, in particular arcs, are concluded from an analysis of a recorded current and/or voltage curve. Corresponding algorithms or methods are known, also on the part of the Applicant.

Preferably, the measuring arrangement 12 is a measuring arrangement for measuring electrical quantities. In particular, the measuring arrangement 12 comprises a current measuring arrangement, preferably comprising at least one shunt, one Hall sensor, one Foerster probe and/or a current transformer, such as a summation current transformer. Furthermore, the measuring arrangement 12 preferably comprises a voltage measuring arrangement, preferably comprising a high-impedance measuring resistor.

The electronic control unit 13 of the low-voltage circuit protection device 1 is preferably formed comprising a microcontroller or microprocessor. The electronic control unit 13 is designed to process the measuring signals supplied by the measuring arrangement 12 and to subsequently control a semiconductor circuit arrangement 11 and preferably further assemblies of the low-voltage circuit protection device 1.

It is provided that the low-voltage circuit protection device 1 or the measuring arrangement 12 are designed in cooperation with the electronic control unit 13 to be able to detect a plurality, i.e. at least two, preferably at least three electrical errors. The electrical errors are errors selected from the following, not necessarily completed group: Overvoltage, undervoltage, overcurrent, in particular short-circuit current, fault current and/or arc, whereby an arc may be a serial and/or a parallel arc. Particularly preferably, the low-voltage circuit protection device 1 is designed to detect all of these faults. It should be noted that the occurrence of each of these errors is intended on its own, but that a simultaneous occurrence of multiple errors should be recognized. This would be the case of a short circuit of an outer conductor to ground.

The electronic control unit 13 is preferably connected to a communication interface of the low-voltage circuit protection device 1, in order to be able to send data to the ascertained network states or errors. This simplifies troubleshooting and repair.

It is further provided that the semiconductor circuit arrangement 11 is designed such that it can reduce the output voltage of the low-voltage circuit protection device 1 relative to the input voltage of the low-voltage circuit protection device 1 as specified, if it is driven by the electronic control unit 13 accordingly.

The use of the terms "diminishing," "reducing," and/or "lowering," is not meant to represent a complete shutdown of the input voltage. The terms are used objectively synonymously. The reduced output voltage should continue to be an electrical voltage significantly greater than zero. It is preferably provided that the output voltage is reduced to a value which is sufficiently high, so that a variety of common switching power supplies can still be supplied with this voltage. It is therefore particularly preferred for the semiconductor circuit arrangement 11 to be designed and arranged in the low-voltage circuit protection device 1 to lower the output voltage to 45-50 V AC or 110-120 V DC.

The lowering of the output voltage by means of the semiconductor circuit arrangement 11 can be done in different ways and with different circuit structure and also operation of the circuit.

According to a first preferred embodiment, as shown in FIG. 1 in the form of a block diagram, a mechanical bypass switch 8 is arranged in the outer conductor section 2 of the low-voltage circuit protection device 1. The semiconductor circuit arrangement 11 is arranged parallel to this, and has according to the illustrated preferred embodiment, a rectifier, a number of power semiconductors 14, in particular an IGBT, and a snubber. However, deviating circuits and components may be provided in this regard. When opening the bypass switch 8, the current commutates to the previously switched semiconductor circuit arrangement 11. By clocking on/off, for example according to a PWM, the current or the voltage can be controlled at the output.

According to FIG. 2, it is provided that the semiconductor circuit arrangement 11 is designed as an electrical inverter 16, or that the entire low-voltage circuit protection device 1 is an inverter, which can fulfill the corresponding protective functions, and has the additional assemblies which a conventional inverter does not have. Another name for inverter 16 is power inverter. The lowering of the output voltage is easily possible by means of an inverter 16 and is familiar to the person skilled in the art. In contrast to FIG. 1, the semiconductor circuit arrangement 11 is constantly in the flow of current.

It is preferably provided that the electronic control unit 13 and the semiconductor circuit arrangement 11 lower or reduce the output voltage within a predefinable first period of time as specified, and are designed accordingly to perform such a reduction. The first period of time is preferably between 0.5 ms and 2 ms, in particular substantially 1 ms. The rapid reduction of the output voltage can prevent damage to people or equipment. As already stated, this reduction takes place within the first period to the voltage value greater than zero.

Subsequently, it is preferably provided that the output voltage is left at the lowered level for a second period of time, and then completely shut down, thus bringing the output voltage to zero. Accordingly, it is preferably provided that the low-voltage circuit protection device 1, in particular the electronic control unit 13 and the semiconductor circuit arrangement 11, is designed to switch off the output voltage after a predefinable second period of time after its lowering. The second period of time is preferably between 0.8 s and 1.2 s, in particular substantially 1 s. This time of about one second is sufficiently long to allow emergency storage of sensitive data, while the power loss to the semiconductor circuit device 11 can be kept low.

For complete shutdown of the output voltage, it has proved to be advantageous that the low-voltage circuit protection device 1 has electrical isolating contacts 9 for electrical isolation, and that the electrical isolating contacts 9 are connected to the control of the electronic control unit 13. The respective isolating contacts 9 are intended to ensure only the electrical isolation after the semiconductor circuit 11 has already completed the flow of current through the low-voltage circuit breaker 1.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A low-voltage circuit protection device, comprising:
   at least one outer conductor section from an outer conductor supply terminal of the low-voltage circuit protection device to an outer conductor load terminal of the low-voltage circuit protection device;
   a neutral conductor section from a neutral terminal of the low-voltage circuit protection device to a neutral load terminal of the low-voltage circuit protection device;
   an electrical measuring arrangement;
   at least one semiconductor circuit arrangement; and
   an electronic control unit which is connected to the electrical measuring arrangement and the semiconductor circuit arrangement,
   wherein the measuring arrangement and/or the electronic control unit is configured to detect a predetermined combination of at least two electrical faults selected from the group comprising: overvoltage, undervoltage and overcurrent, and
   wherein the semiconductor circuit arrangement is configured to provide a specifiable reduction of an output voltage applied at the outer conductor supply terminal and the neutral conductor load terminal of the low-voltage circuit protection unit relative to an input voltage applied to the outer conductor supply terminal and neutral conductor terminal of the low-voltage circuit protection device,
   wherein the semiconductor circuit arrangement is configured to lower the output voltage of the low-voltage circuit protection device to 45-50 V AC and 110-120 V DC.

2. The low-voltage circuit protection device according to claim 1, wherein the electronic control unit and the semiconductor circuit arrangement are configured to specifiably reduce the output voltage within a predeterminable first period of time.

3. The low-voltage circuit protection device according to claim 2, wherein the first time period is between 0.5 ms and 2 ms.

4. The low-voltage circuit protection device according to claim 3, wherein the first time period is substantially 1 ms.

5. The low-voltage circuit protection device according to claim 2, wherein the electronic control unit and the semiconductor circuit arrangement are configured to switch off the output voltage after a predetermined second time period after their lowering.

6. The low-voltage circuit protection device according to claim 5, wherein the second time period is between 0.8 s and 1.2 s.

7. The low-voltage circuit protection device according to claim 6, wherein the second time period is substantially 1 s.

8. The low-voltage circuit protection device according claim 1, further comprising a mechanical bypass switch arranged in the outer conductor section,
   wherein the semiconductor circuit arrangement is connected in parallel to the mechanical bypass switch, and
   wherein the semiconductor circuit arrangement comprises at least one power semiconductor.

9. The low-voltage circuit protection device according to claim 8, wherein the at least one power semiconductor comprises an IGBT.

10. The low-voltage circuit protection device according to claim 1, wherein the semiconductor circuit arrangement comprises an electrical inverter.

11. The low-voltage circuit protection device according to claim 1, further comprising electrical isolating contacts for galvanic isolation, and
    wherein the electrical isolating contacts are connected for their control with the electronic control unit.

12. The low-voltage circuit protection device according to claim 1, wherein the measuring arrangement and/or the electronic control unit is configured to detect a predetermined combination of at least three electrical faults selected from the group comprising: overvoltage, undervoltage, overcurrent comprising short-circuit current, fault current, and/or arc.

13. The low-voltage circuit protection device according to claim 12, wherein the measuring arrangement and/or the electronic control unit is configured to detect all electrical faults selected from the group comprising: overvoltage, undervoltage, overcurrent comprising short-circuit current, fault current, and/or arc.

14. The low-voltage circuit protection device according to claim 1, wherein the electrical faults comprise short-circuit current, fault current and/or arc.

* * * * *